United States Patent
Tsuchiya et al.

(10) Patent No.: US 10,622,115 B2
(45) Date of Patent: Apr. 14, 2020

(54) FLEXIBLE CONDUCTIVE FILM AND PROCESS FOR PRODUCING THE SAME

(71) Applicant: NATIONAL INSTITUTE OF ADVANCED INDUSTRIAL SCIENCE AND TECHNOLOGY, Tokyo (JP)

(72) Inventors: Tetsuo Tsuchiya, Tsukuba (JP); Yuuko Uzawa, Tsukuba (JP); Tomohiko Nakajima, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/539,579

(22) PCT Filed: Dec. 25, 2015

(86) PCT No.: PCT/JP2015/086423
§ 371 (c)(1),
(2) Date: Jun. 23, 2017

(87) PCT Pub. No.: WO2016/104796
PCT Pub. Date: Jun. 30, 2016

(65) Prior Publication Data
US 2018/0019038 A1   Jan. 18, 2018

(30) Foreign Application Priority Data
Dec. 26, 2014  (JP) ................................ 2014-266006

(51) Int. Cl.
| | | |
|---|---|---|
| H01B 1/22 | (2006.01) |
| B32B 7/02 | (2019.01) |
| B32B 15/04 | (2006.01) |
| B32B 9/00 | (2006.01) |
| H01B 5/14 | (2006.01) |
| H01B 13/00 | (2006.01) |
| H05K 1/02 | (2006.01) |

(52) U.S. Cl.
CPC ............... *H01B 1/22* (2013.01); *B32B 7/02* (2013.01); *B32B 9/00* (2013.01); *B32B 15/04* (2013.01); *H01B 5/14* (2013.01); *H01B 13/0016* (2013.01); *B32B 2307/202* (2013.01); *B32B 2309/105* (2013.01); *H05K 1/0224* (2013.01); *H05K 1/0259* (2013.01); *H05K 2201/0154* (2013.01); *H05K 2201/0715* (2013.01)

(58) Field of Classification Search
CPC ...... H01B 1/20–1/22; B32B 7/02; B32B 9/00; B32B 15/04
See application file for complete search history.

(56) References Cited

U.S. PATENT DOCUMENTS

| | | | | |
|---|---|---|---|---|
| 5,225,273 A | * | 7/1993 | Mikoshiba ............ | C23C 14/024 428/212 |
| 2009/0294964 A1 | | 12/2009 | Higashi et al. | |
| 2010/0304048 A1 | | 12/2010 | Yukinobu et al. | |
| 2012/0223302 A1 | | 9/2012 | Yukinobu et al. | |
| 2013/0196469 A1 | * | 8/2013 | Facchetti ............ | C23C 18/1216 438/104 |
| 2014/0220724 A1 | * | 8/2014 | Duty ................ | H01L 21/02521 438/69 |

FOREIGN PATENT DOCUMENTS

| | | |
|---|---|---|
| CN | 102598160 A | 7/2012 |
| JP | H02-276630 A | 11/1990 |
| JP | 07192527 A * | 7/1995 |
| JP | 10045427 A * | 2/1998 |
| JP | H10-241464 A | 9/1998 |
| JP | H10-335110 A | 12/1998 |
| JP | 2001-196201 A | 7/2001 |
| JP | 2003-096572 A | 4/2003 |
| JP | 2004-055363 A | 2/2004 |
| JP | 2004-355933 A | 12/2004 |
| JP | 2009-105263 A | 5/2009 |
| JP | 2009-290112 A | 12/2009 |
| JP | 2010-219076 A | 9/2010 |
| JP | 2011-003446 A | 1/2011 |
| JP | 2012-009148 A | 1/2012 |
| JP | 2012-216425 A | 11/2012 |
| WO | 2009/102079 A1 | 8/2009 |

OTHER PUBLICATIONS

Machine translation of JP H10-045427. Retrieved Mar. 29, 2019.*
Machine translation of JP H07-192527. Retrieved Mar. 29, 2019.*
Murakami et al. "Preparation of Ruthenium Metal and Ruthenium Oxide Thin Films by a Low-Temperature Solution Process". Proceedings of the 20th International Display Workshops (IDW 2013); pp. 1573-1576.*
Megaw, H.D. "Changes in Polycrystalline Barium-Strontium-Titanate at its Transition Temperature". Nature, vol. 157, No. 3975, (1946); pp. 20-21.*
Murakami et al. "Highly conductive ruthenium oxide thin films by a low-temperature solution process and green laser annealing", Materials Letters 152 (2015); pp. 121-124.*

(Continued)

*Primary Examiner* — Prashant J Khatri
(74) *Attorney, Agent, or Firm* — Studebaker & Brackett PC

(57) ABSTRACT

A first object is to provide a conductive film which is flexible from the standpoint that bending in a bending test or the like does not largely change its electrical resistance. Provided is a process for producing a flexible conductive film including applying a solution or dispersion containing at least any one of metal organic compounds, metals, and metal oxides onto a base material and treating the resulting film by at least either one of a heating step at a temperature not deteriorating the base material or an irradiation step with ultraviolet light, microwaves, or plasma.

7 Claims, 1 Drawing Sheet

(56) References Cited

OTHER PUBLICATIONS

International Search Report issued in PCT/JP2015/086423; dated Feb. 2, 2016.
International Preliminary Report on Patentability (Chapter I) and Translation of Written Opinion of the International Searching Authority; PCT/JP2015/086423; dated Jun. 27, 2017.
Wataru Sugimoto, "Supercapacitor", Surface Technologies, 2010, pp. 14-17, vol. 61, No. 1, Japan.

\* cited by examiner

FLEXIBLE CONDUCTIVE FILM AND PROCESS FOR PRODUCING THE SAME

TECHNICAL FIELD

The present invention relates to a flexible conductive film containing a metal oxide and a process for producing the same.

BACKGROUND ART

In recent years, light-weight flexible electronic components, sensors, or wirings have been necessary and indispensable to satisfy size or weight reduction or efficiency enhancement of electronic devices, energy devices, or the like. It is known to perform pattern application of a conductive paste onto a printed wiring board or flexible printed board to form a circuit or electrode and thereby form a flexible circuit wiring. As the paste, known is a conductive paste containing (A) a metal such as Ag (silver), Au (gold), Cu (copper), Al (aluminum), Ni (nickel), Pt (platinum), or Pd (palladium), (B) a resin having one or more groups selected from the group consisting of an epoxy group, an oxetane group, a 3,4-epoxycyclohexyl group, and from 5 to 8-membered cyclic ether groups and reactive with a carboxyl group, and (C) a curing agent reactive with the above-described resin (refer to Patent Document 1).

A circuit or electrode formed using such a conductive paste, however, poses problems such as decomposition of the resin or oxidation of a metal lacking in heat resistance, for example, under high temperature conditions of from about 300° C. to 400° C.

Metal oxide materials are on the other hand characterized in that they are stable to an oxidation reaction even at high temperatures and they are more inexpensive than noble metals so that they can be used widely as a resistor material. However, electronic parts such as resistors have conventionally been manufactured by screen printing an inorganic material paste obtained by mixing a conductive material, a glass frit, a vehicle, and an appropriate organic solvent to a base material made of an inorganic material such as alumina and then drying and firing the resulting base material. It is therefore difficult to manufacture them on a flexible board such as polyethylene terephthalate (PET) because it usually includes a high-temperature firing procedure (refer to Patent Documents 2 to 4).

CITATION LIST

Patent Documents

Patent Document 1: JP2004-355933A
Patent Document 2: JP2009-105263A
Patent Document 3: JP2001-196201A
Patent Document 4: JP10(1998)-335110A

SUMMARY

Technical Problem

The inorganic material paste is conventionally a material containing an inorganic material, glass, and a binder and, for example, a resistor is manufactured by applying a paste containing a ruthenium oxide to a base material by screen printing or the like and then firing it at 800° C. It is therefore difficult to manufacture an oxide resistor on a substrate lacking in heat resistance.

Even if an oxide conductive film can be formed on a substrate lacking in heat resistance, the resulting conductive film is not flexible because cracks or the like occur due to bending in a bending test or the like and they inevitably cause an increase in electrical resistance. Further, the film, when it has a thickness of 500 nm or less, does not satisfy a sheet resistance of 300Ω/□ or less at room temperature or an electrical resistance at a temperature from room temperature to 300° C. changes by more than 5% compared with an electrical resistance at room temperature.

The present invention has been made based on such a conventional technology and an object is to provide a conductive film which is flexible from the standpoint that the electrical resistance of it does not change largely due to bending in a bending test or the like.

An additional object is to provide a conductive film having a sheet resistance of 300Ω/□ or less at room temperature when it has a thickness of 500 nm or less.

Another additional object is to provide a conductive film which undergoes a change in electrical resistance of 5% or less at a temperature up to 300° C. relative to an electrical resistance at room temperature [{(sheet resistance at a predetermined temperature between from 25 to 300° C.)–(sheet resistance at 25° C.)}/(sheet resistance at 25° C.)].

A further object of the present invention is to provide a method of producing a flexible conductive film as described above.

Solution to Problem

With the foregoing problems in view, the present inventors have proceeded with test and research. They have obtained the following findings (i) to (iii).

(i) A flexible conductive film containing a metal oxide can be prepared by applying a solution or dispersion containing at least any one of metal organic compounds, metals, and metal oxides onto a base material such as an organic material and treating the resulting film by at least either one of a heating step at a temperature not deteriorating the base material or an irradiation step with ultraviolet light, microwaves, or plasma.

(ii) The flexible conductive film can include various ones having a sheet resistance of 1 KΩ/□ or less or 300Ω/□ or less at room temperature when they have a film thickness of 500 nm or less.

(iii) The flexible conductive film undergoes a change in electrical resistance of 5% or less at a temperature from room temperature to 300° C.

The present invention has been completed based on the above-described findings. The following inventions are provided according to the present application.

<1> A flexible conductive film formed on a base material, wherein the conductive film comprises a metal oxide.

<2> The flexible conductive film as described above in <1>, characterized in that the conductive film comprises, as a main component thereof, one or more components selected from ruthenium oxides, perovskite oxides, and tin oxides.

<3> The flexible conductive film as described above in <1> or <2>, characterized in that the conductive film has a laminated structure of a metal film and a metal oxide film.

<4> The flexible conductive film as described above in <1> or <2>, characterized in that the conductive film is a composite between metal fine particles and metal oxide fine particles.

<5> The flexible conductive film as described above in any of <1> to <4>, characterized in that the film has a sheet resistance of 300Ω/□ or less at room temperature when it has a thickness of 500 nm or less.

<6> The flexible conductive film as described in any one of <1> to <5>, characterized in that a change in resistance that occurs from room temperature to 300° C. is within 5%.

<7> A process for producing the flexible conductive film as described above in any one of <1> to <6>, including applying, onto a base material, a solution or dispersion containing at least any one of metal organic compounds, metals, and metal oxides and converting the film into a flexible conductive film by treating the film by at least either one of a heating step at a temperature not deteriorating the base material or an irradiation step with ultraviolet light, microwave, or plasma.

The present invention may include the following modes.

<8> The flexible conductive film as described above in <3> or <4>, characterized in that the metal material is palladium and the metal oxide is a ruthenium oxide.

<9> The flexible conductive film as described above in any one of <1> to <6> and <8>, characterized in that the base material is formed using an organic material.

<10> The process for producing the flexible conductive film as described above in <7>, characterized in that the metal organic compound is any one or more of metal organic acid salts, metal acetylacetonates, metal chlorides, and metal alkoxides.

<11> The process for producing the flexible conductive film as described above in <7> or <10>, characterized in that a solvent of the solution contains any one of propionic acid, acetylacetonate, ethylene glycol, pyridine, toluene, xylene, ethanol, methanol, butanol, propylene glycol, and ethylene glycol.

<12> The process for producing the flexible conductive film as described above in <7>, characterized in that a light source of the ultraviolet light is selected from an excimer lamp, an excimer laser, a YAG laser, a high-pressure mercury lamp, a low-pressure mercury lamp, a microwave excited metal halide lamp, a microwave excited mercury lamp, and a flash lamp.

Advantageous Effects of Invention

The flexible conductive film of the present invention is said to be "flexible" from the standpoint that it is formed on a flexible base material and does not undergo a large change in resistance value even after repetition of bending.

The flexible conductive film of the present invention can have a sheet resistance of 1 KΩ/□ or less or 300Ω/□ at room temperature when it has a film thickness of 500 nm or less. Since the film is composed mainly of a metal oxide material and a change in resistance due to corrosion or oxidation can be prevented even under a high-temperature environment, a change in resistance at a temperature from room temperature to 300° C. can be suppressed to 5% or less.

In addition, the flexible conductive film of the present invention using a flexible organic material base material achieves weight reduction and space saving of a device or the like.

Further, the flexible conductive film of the present invention can be produced in good efficiency and is therefore suited for mass production. This invention contributes to cost reduction. For example, when a resistor film is formed on a polyimide substrate, the resistance of a flexible resistor formed according to the present invention can be controlled to from 10Ω to 1 MΩ even if the film has a thickness of 1 μm or less. Even after tested in fatigue by bending, it has excellent stability and undergoes a small change in resistance. Further, the present invention produces an excellent advantage that it can conveniently produce not only a resistor but also flexible conductive films made of various oxide materials showing semiconductor-like properties.

DESCRIPTION OF EMBODIMENTS

Figure 1:
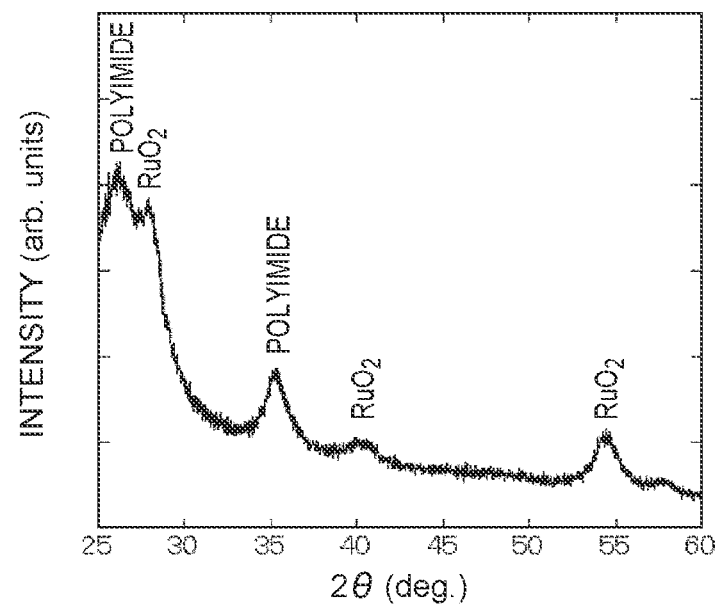
FIG. 1 shows an X-ray diffraction pattern of a flexible conductive film (resistor film) formed on a polyimide base material in Example of the present invention.

The flexible conductive film of the present invention is formed on a base material, contains a conductive metal oxide, and has flexibility (pliability).

The term "flexible" used herein means that after a bending test in which 180° bending/stretching of a film on a base material is repeated 150 times, a change in sheet resistance of the film is 10% or less.

The thickness of the conductive film is not limited and is usually from 10 nm to 100 μm, preferably from 50 nm to 1 μm, more preferably from about 100 to 500 nm. The sheet resistance of the conductive film can be set at an appropriate value within a range of from 10Ω/□ to $10^{10}$Ω/□ (for example, 100Ω/□ or less, 200Ω/□ or less, 300Ω/□ or less, from 500Ω/□ to 10 KΩ□, or from 50 KΩ/□ to 1 MΩ/□), depending on the using purpose of the film such as circuit film, electrode film, resistor film, semiconductor film, electromagnetic wave shielding film, or antistatic film. In particular, the film can have a sheet resistance of 1 KΩ/□ or less or 300Ω/□ or less at room temperature when it has a film thickness of 500 nm or less.

The metal oxide contained in the conductive film is any metal oxide insofar as it has resistivity of $10^5$ Ω·cm or less (preferably $10^4$ Ω·cm or less, more preferably $10^3$ Ω·cm or less). Examples include ruthenium oxide, perovskite oxides, tin oxide, and vanadium oxide, composite oxides thereof, and perovskite-based oxides (for example, lanthanum manganese oxide, lanthanum iron oxide, and lanthanum copper oxide). Ruthenium oxide or tin oxide may be doped with from 2 to 25 atomic % (preferably from 5 to 15 atomic %) of one or more of antimony, niobium, tantalum, nickel, and aluminum.

These metal oxides may be used either singly or as a mixture of two or more of them.

The conductive film of the present invention contains a conductive metal oxide as a main component (from 50 to 100 wt %) but it may be a composite containing less than 50% metal fine particles for safety. Examples of the material of the metal fine particles include niobium, tantalum, copper, vanadium, iron, palladium, and silver.

In addition, the conductive film of the present invention may contain less than 50 wt % of insulating fine particles having an electrical resistance more than $10^6$ Ω·cm in order to make its resistance greater than that of a conductive metal oxide film. Examples of the material of the insulating fine particles include glass, alumina, and zirconium oxide. A high heat-resistant resin may be used insofar as it is an insulating material.

An inorganic film constituting such a conductive film is prepared by dissolving or dispersing at least any of inorganic material particles and metal organic compounds in a solvent, mixing the resulting precursor solution or dispersion with glass or vehicle according to the using purpose, applying the resulting precursor solution or dispersion to a base material, and treating the resulting film by at least a heating step at a temperature not deteriorating the base material and an irradiation step with ultraviolet light, microwaves, or plasma. A conductive film made of a plurality of layers of an inorganic oxide can also be obtained by repeating a combination of the application step and the heating and/or irradiation step a plurality of times.

The inorganic material particles contained in the precursor can change a temperature coefficient of resistance (change in electrical resistance) by using fine particles crystallized in advance and amorphous fine particles either singly or in combination. For example, a conductive film having a temperature coefficient of resistance of 100 ppm/K or less, which is used in chip resistance, can be formed on a resin substrate. Alternatively, the metal organic compound contained in the solution can optimize a temperature coefficient of resistance (change in electrical resistance) by controlling a formation ratio of an amorphous phase or crystal phase by at least either one of a heating step at a temperature not deteriorating the base material or an irradiation step with ultraviolet light, microwaves, or plasma.

Further, it can be formed on an inorganic film, which has been formed on a base material by sputtering, CVD, or the like, by treating by at least either one of a heating step at a temperature not deteriorating the base material or an irradiation step with ultraviolet light, microwaves, or plasma.

The conductive film of the present invention obtained by the above-described production process can be a flexible film showing a resistance change of 10% or less (preferably 5% or less, more preferably 1% or less) between before and after a bending test and can be a film undergoing a change in electrical resistance at a temperature between room temperature to 200° C. relative to the electrical resistance at room temperature [{(sheet resistance at a predetermined temperature between from 25 to 200° C.)−(sheet resistance at 25° C.)}/(sheet resistance at 25° C.)]of 10% or less (preferably 5% or less, more preferably 1% or less).

The conductive film of the present invention can also be formed as a conductive film having lower resistance by laminating a metal film and a metal oxide film one after another. The metal film may be formed on one surface of the metal oxide film or may be formed on both surfaces. The thickness of the metal film (when a plurality of metal films is contained, the thickness corresponds to a total thickness of these films) is from 0 to 50%, preferably from 0 to 30% of the flexible conductive film. As the material of the metal film, Pd or Ag is preferred from the standpoint of cost, but platinum, gold, tin, or nickel can also be used.

The metal film can be prepared by dissolving or dispersing at least any of metal organic compounds and metal nanoparticles in a solvent, mixing the resulting precursor solution or dispersion with a vehicle depending on the purpose, applying the resulting precursor solution or dispersion to a base material or an inorganic oxide film, and treating the resulting film by at least one of a heating step at a temperature not deteriorating the base material and an irradiation step with ultraviolet light, microwaves, or plasma. Any method such as vapor phase synthesis or plating may be used insofar as a film can be formed under conditions not deteriorating the base material.

Although the metal organic compound to be used for the preparation of the metal oxide film or metal film is not limited, examples of it include metal organic acid salts, metal acetylacetonates, metal chlorides, and metal alkoxides.

Although the solvent to be used for the preparation of the metal oxide film or metal film is not limited, examples of it include propionic acid, acetylacetonate, ethylene glycol, pyridine, toluene, xylene, ethanol, methanol, butanol, propylene glycol, and ethylene glycol. They may be used either singly or as a mixture of two or more of them.

Although the vehicle to be used for the preparation of the metal oxide film or metal film is not limited, examples of it include alkyd resins, aminoalkyd resins, acrylic resins, acrylic lacquer resins, polyester resins, epoxy resins, butylated melamine resins, methylated melamine resins, rosin-modified phenol resins, polyurethane resins, styrene resins, styrene acrylic resins, styrene-diene copolymers, vinyl chloride copolymers, vinyl acetate resins, vinyl acetate copolymers, ethylene-vinyl acetate resins, butyral resins, drying oils, and boiled oils.

Although the light source of ultraviolet light in the irradiation step is not limited, usable examples of it include excimer lamp, excimer laser, YAG laser, high-pressure mercury lamp, low-pressure mercury lamp, microwave excited metal halide lamp, microwave excited mercury lamp, and flash lamp. Irradiation with the lamp is preferred from the standpoint of cost.

The base material on the surface of which the flexible conductive film is formed may be either an organic material or an inorganic material.

Although the organic material is not limited, usable examples of it include polyimides, acrylic resins, polyesters [PET, polyethylene naphthalate (PEN), and the like], polyacrylonitrile, aramid resins, liquid crystal polymers (LCP), polyether imides (PEI), and polycarbonates.

When such base materials are used, the conductive film may be formed as a film equipped with carbon formed by a photoreaction of the precursor raw material and the resin caused by the irradiation with ultraviolet light.

As the inorganic material, for example, a thin-film glass, metal, or the like which contributes to flexibility can be used.

The thickness of the base material is not limited insofar as it allows the base material to have pliability and is usually from about 20 μm to 2 mm, preferably from about 30 μm to 1 mm, more preferably from about 50 μm to 500 μm.

EXAMPLES

A description will hereinafter be made based on Examples. The present examples are only examples and the present invention is not limited by them. This means that the present invention is limited only by claims and embraces various modifications other than Examples included in the present invention.

Example 1

In 0.1 g of ruthenium powders (product of Wako Pure Chemical Industries) was poured 2.5 ml of a ruthenium metal organic compound solution (product of Daiken Chemical) and the resulting mixture was ground in a planetary mill at 700 rpm (product of Nagao System, "Planet M2-3F). The resulting solution was applied to a polyimide base material, followed by irradiation with ultraviolet light to obtain a conductive film of 30Ω/□. The resulting conductive film was determined to be a ruthenium oxide film as a result of X-ray diffraction measurement. The polyimide base material having the conductive film {2 cm×2 cm} thereon was subjected to 180° bending and stretching 150 times, but a change in sheet resistance of the conductive film after restoration was less than 2.7%.

Example 2

An operation similar to that of Example 1 except for the use of alumina instead of the polyimide as a base material was performed. As a result, a conductive film having 180Ω/□ was obtained. The resulting conductive film was not subjected to a bending and stretching test, but it is presumed to be flexible similar to the film of Example 1.

Example 3

In a manner similar to that of Example 1 except that an alumina base material was used as a base material and irradiation with ultraviolet light was replaced by firing at 500° C., a conductive film having 200Ω/□ was obtained. The resulting conductive film was not subjected to a bending and stretching test, but it is presumed to be flexible similar to the film of Example 1.

Example 4

After mixing 1 ml of a ruthenium metal organic compound solution (product of Daiken Chemical) with 1 ml of toluene and spin coating of a polyimide film with the resulting mixture at 2000 rpm, the resulting film was irradiated with ultraviolet light for 20 minutes to obtain a conductive film having 300Ω/□. As shown in FIG. 1, the conductive film thus obtained was determined to be a ruthenium oxide film as a result of X-ray diffraction measurement.

Example 5

Figure 2:
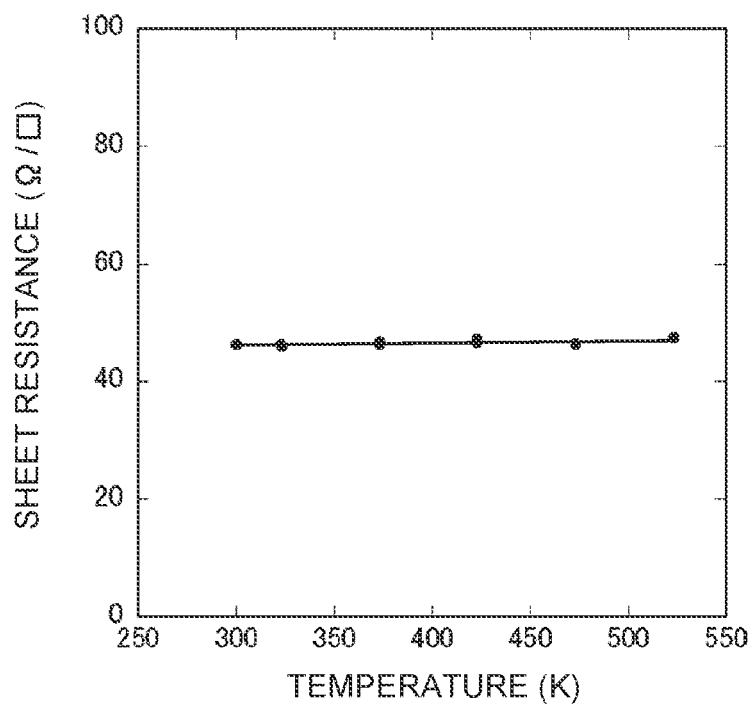
FIG. 2 shows the relationship of the flexible conductive film (resistor film) of Example of the present invention between sheet resistance and temperature.

A three-layer conductive film having 50Ω/□ was prepared by repeating the coating with the solution and irradiation with ultraviolet light for the conductive film formed on the polyimide film obtained in Example 2. The evaluation of the temperature dependence of the electrical properties of the three-layer ruthenium oxide film formed on the polyimide film by coating was evaluated. The resistance of the resulting film at room temperature was 50Ω/□, the resistance change ratio at a temperature up to 200° C. was 0.2%, and the resistance change ratio up to 250° C. was 2.4% (refer to FIG. 2).

The polyimide base material having a three-layer film {2 cm×2 cm} formed by coating was subjected to 180° bending and stretching 150 times, but a change in sheet resistance of the conductive film after restoration was less than 2.5%.

Example 6

In a manner similar to that of Example 4 except that an alumina base material was used as a base material and irradiation with ultraviolet light was replaced by firing at 500° C., a conductive film having 600 kΩ/□ was obtained. The resulting conductive film was not subjected to a bending and stretching test, but it is presumed to be flexible similar to the film of Example 4 or 5.

Example 7

In a manner similar to that of Example 2, a polyimide film was coated with a ruthenium metal organic compound solution and irradiated with ultraviolet light to obtain a ruthenium oxide film.

Then, the ruthenium oxide film was coated with a palladium metal organic acid salt [product of Wako Pure Chemical Industries] and then irradiated with ultraviolet light to obtain a conductive film having 20Ω/□. The polyimide base material {2 cm×2 cm} having thereon a ruthenium oxide/palladium film was subjected to 180° bending and stretching 150 times but a change in sheet resistance of the conductive film after restoration was less than 3.3%.

Example 8

In a manner similar to that of Example 1, the precursor solution was applied to polyimide, followed by 248-nm excimer laser irradiation to form a ruthenium oxide film.

Example 9

In a manner similar to that of Example 1, the precursor solution was applied to LCP (liquid crystal polymer), followed by irradiation with ultraviolet light to form a ruthenium oxide film.

Example 10

In a manner similar to that of Example 1, a ruthenium metal organic compound solution was applied to LCP (liquid crystal polymer), followed by 248-nm excimer laser irradiation to form a ruthenium oxide film.

Example 11

In a manner similar to Example 4, a ruthenium metal organic compound solution was applied to SiN/polyimide, followed by 248-nm excimer laser irradiation to form a ruthenium oxide film.

Example 12

In a manner similar to that of Example 1 except that the amount of the ruthenium powders (Wako Pure Chemical Industries) was changed from 0.1 g to 0.3 g, 2.5 ml of a ruthenium metal organic compound solution (product of Daiken Chemical) was poured in the ruthenium powders and the resulting mixture was ground in a planetary mill (product of Nagao System, "Planet M2-3F") at 700 rpm. The resulting solution was applied to a polyimide base material, followed by irradiation with ultraviolet light to obtain a conductive film having 15 Ω/□.

Example 13

In a manner similar to that of Example 1 except that the amount of the ruthenium powders (Wako Pure Chemical Industries) was changed from 0.1 g to 0.3 g, 2.5 ml of a ruthenium metal organic compound solution (product of Daiken Chemical) was poured in the ruthenium powders and the resulting mixture was ground in a planetary mill (product of Nagao System, "Planet M2-3F") at 700 rpm. The resulting solution was applied to a polyimide base material, followed by irradiation with an excimer lamp to obtain a conductive film.

Example 14

In a manner similar to that of Example 1 except that the amount of the ruthenium powders (Wako Pure Chemical Industries) was changed from 0.1 g to 0.3 g, 2.5 ml of a ruthenium metal organic compound solution (product of Daiken Chemical) was poured in the ruthenium powders and the resulting mixture was ground in a planetary mill (product of Nagao System, "Planet M2-3F") at 700 rpm. The resulting solution was applied to a polyimide base material, followed by irradiation with a high-pressure mercury lamp to obtain a conductive film.

Example 15

In a manner similar to that of Example 1 except that the amount of the ruthenium powders (Wako Pure Chemical Industries) was changed from 0.1 g to 0.3 g, 2.5 ml of a ruthenium metal organic compound solution (product of Daiken Chemical) was poured in the ruthenium powders and the resulting mixture was ground in a planetary mill (product of Nagao System, "Planet M2-3F") at 700 rpm. The resulting solution was applied to a polyimide base material, followed by 248-nm excimer laser irradiation to obtain a conductive film.

Example 16

In a manner similar to that of Example 1 except that the amount of the ruthenium powders (Wako Pure Chemical Industries) was changed from 0.1 g to 0.3 g, 2.5 ml of a ruthenium metal organic compound solution (product of Daiken Chemical) was poured in the ruthenium powders and the resulting mixture was ground in a planetary mill (product of Nagao System, "Planet M2-3F") at 700 rpm. The resulting solution was applied to a polyimide base material, followed by 193-nm excimer laser irradiation to obtain a conductive film.

Example 17

In a manner similar to that of Example 1 except that the amount of the ruthenium powders (Wako Pure Chemical Industries) was changed from 0.1 g to 0.3 g, 2.5 ml of a ruthenium metal organic compound solution (product of Daiken Chemical) was poured in the ruthenium powders and the resulting mixture was ground in a planetary mill (product of Nagao System, "Planet M2-3F") at 700 rpm. The resulting solution was applied to a polyimide base material, followed by irradiation with plasma for 5 minutes to obtain a conductive film.

Example 18

In a manner similar to that of Example 1 except that the amount of the ruthenium powders (Wako Pure Chemical Industries) was changed from 0.1 g to 0.3 g, 2.5 ml of a ruthenium metal organic compound solution (product of Daiken Chemical) was poured in the ruthenium powders and the resulting mixture was ground in a planetary mill (product of Nagao System, "Planet M2-3F") at 700 rpm. The resulting solution was applied to a polyimide base material, followed by excimer laser irradiation to obtain a conductive film. From the Raman spectrum, carbon was identified.

Example 19

A ruthenium metal organic compound solution was applied to a polyimide base material, followed by excimer laser irradiation to obtain a conductive film. From the Raman spectrum, carbon was identified.

Example 20

In a manner similar to that of Example 1 except for the use of antimony-doped tin oxide instead of the ruthenium powders, an antimony-doped tin metal organic compound solution was poured in the antimony-doped tin oxide and the resulting mixture was ground in a planetary mill (product of Nagao System, "Planet M2-3F") at 700 rpm. The resulting solution was applied to a polyimide base material, followed by 193-nm excimer laser irradiation to obtain a conductive film having 50 $\Omega/\square$.

Example 21

In a manner similar to that of Example 1 except for the use of antimony-doped tin oxide instead of the ruthenium powders, an antimony-doped tin metal organic compound solution was poured in the antimony-doped tin oxide and the resulting mixture was ground in a planetary mill (product of Nagao System, "Planet M2-3F") at 700 rpm. The resulting solution was applied to a polyimide base material, followed by irradiation with a high-pressure mercury lamp to obtain a conductive film having 100 $\Omega/\square$.

INDUSTRIAL APPLICABILITY

In the present invention, flexible conductive films having various electrical resistance values can be obtained so that they can be used as not only a circuit film or electrode film but also a variety of conductive films such as resistor film, semiconductor film, electromagnetic wave shielding film, and anti-static film.

What is claimed is:

1. A flexible conductive film comprising a resin substrate and a conductive film formed directly on the resin substrate,
    wherein a phase of the conductive film consists of a crystal phase or a crystal phase and an amorphous phase,
    wherein the conductive film consists of a conductive metal oxide and carbon, or a metal, the conductive metal oxide and carbon, and
    wherein the conductive metal oxide is at least one selected from the group consisting of ruthenium oxide and perovskite oxide,
    wherein the resin substrate comprises, as a main component thereof, one or more selected from the group consisting of a polyimide, an acrylic resin, a polyester, a polyacrylonitrile, an aramid resin, a liquid crystal polymer (LCP), a polyether imide (PEI), and a polycarbonate.

2. The flexible conductive film according to claim 1,
    wherein the conductive film consists of the metal, the conductive metal oxide and carbon, and
    wherein the metal and the conductive metal oxide are in the form of a composite of fine particles of the metal and fine particles of the conductive metal oxide.

3. The flexible conductive film according to claim 1,
    wherein the conductive film consists of the metal, the conductive metal oxide and carbon,
    wherein the metal is at least one selected from the group consisting of silver, palladium, copper, and nickel, and
    wherein the metal and the conductive metal oxide are in the form of a composite of fine particles of the metal and fine particles of the conductive metal oxide.

4. The flexible conductive film according to claim 1,
    wherein the phase of the conductive film consists of the amorphous phase and the crystal phase.

5. The flexible conductive film according to claim 1, wherein the conductive film has a sheet resistance of 300Ω/□ or less at 25° C. when the film has a thickness of 500 nm or less.

6. The flexible conductive film according to claim 1, wherein a change in electrical resistance calculated by the following formula:

{(sheet resistance at a predetermined temperature from 25 to 250° C.) (sheet resistance at 25° C.)}/(sheet resistance at 25° C.) is within 5%.

7. The flexible conductive film according to claim 1, further comprising a metal film formed on the conductive film.

\* \* \* \* \*